United States Patent
Ballou et al.

(10) Patent No.: US 9,269,536 B2
(45) Date of Patent: Feb. 23, 2016

(54) DOUBLE ENDED ELECTRODE MANIPULATOR

(71) Applicant: Varian Semiconductor Equipment Associates, Inc., Gloucester, MA (US)

(72) Inventors: Jon Ballou, Beverly, MA (US); Jeannot Morin, Intervale, NH (US); Manny Sieradzki, Georgetown, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/862,058

(22) Filed: Apr. 12, 2013

(65) Prior Publication Data

US 2013/0270450 A1   Oct. 17, 2013

Related U.S. Application Data

(60) Provisional application No. 61/625,428, filed on Apr. 17, 2012.

(51) Int. Cl.
*H01J 37/30* (2006.01)
*H01J 37/15* (2006.01)

(52) U.S. Cl.
CPC ............ *H01J 37/3007* (2013.01); *H01J 37/15* (2013.01); *H01J 2237/083* (2013.01); *H01J 2237/1502* (2013.01); *H01J 2237/31701* (2013.01)

(58) Field of Classification Search
CPC ........... H01J 37/3007; H01J 2237/083; H01J 2237/1502; H01J 2237/31701; H01J 37/15; H01J 27/024; H01J 37/023; H01J 37/04
USPC ............... 250/396 R, 423 R; 313/361, 1, 363
See application file for complete search history.

(56) References Cited

U.S. PATENT DOCUMENTS

| | | | | |
|---|---|---|---|---|
| 4,207,489 A | * | 6/1980 | Camplan | H01J 27/022 250/423 R |
| 4,883,563 A | * | 11/1989 | Kotani et al. | 216/52 |
| 5,065,034 A | * | 11/1991 | Kawanami et al. | 250/505.1 |
| 6,002,208 A | * | 12/1999 | Maishev | H01J 27/143 250/423 R |
| 6,501,078 B1 | * | 12/2002 | Ryding | H01J 37/08 250/396 R |
| 7,807,985 B2 | * | 10/2010 | Itoh | H01J 27/024 250/492.1 |
| 7,842,931 B2 | * | 11/2010 | Satoh | H01J 27/024 250/423 R |
| 7,915,597 B2 | * | 3/2011 | Huang | H01J 37/20 250/396 R |
| 8,097,866 B2 | * | 1/2012 | Olson | H01J 37/304 250/396 R |
| 2003/0155534 A1 | | 8/2003 | Platzgummer et al. | |
| 2007/0091406 A1 | * | 4/2007 | Filhol | G02B 26/0841 359/210.1 |
| 2009/0225297 A1 | * | 9/2009 | Bleidistel | G02B 7/023 355/67 |
| 2010/0072402 A1 | * | 3/2010 | Satoh | H01J 27/024 250/492.21 |
| 2011/0174985 A1 | * | 7/2011 | Peijster | B82Y 10/00 250/400 |
| 2012/0099176 A1 | * | 4/2012 | Zhou | G02B 26/101 359/291 |

OTHER PUBLICATIONS

International Search Report and Written Opinion, mailed Jul. 19, 2013 for PCT/US2013/036538 filed Apr. 15, 2013.

* cited by examiner

*Primary Examiner* — Wyatt Stoffa

(57) ABSTRACT

An electrode adjustment method and apparatus are disclosed for use in workpiece processing. The assembly may include an electrode assembly having first and second ends. First and second manipulators may be coupled to the first and second ends. The manipulators may be used to selectively impart movement to the first and second ends of the electrode assembly to adjust one or more properties of an ion beam passing through the electrodes. The first and second manipulators may be independently actuatable so that the first and second ends of the electrode can be adjusted independent of one another. Methods of using the disclosed apparatus are also disclosed.

18 Claims, 15 Drawing Sheets

DOUBLE ENDED ELECTRODE MANIPULATOR

CROSS-REFERENCE TO RELATED APPLICATIONS

This is a non-provisional of U.S. provisional patent application Ser. No. 61/625,428 filed Apr. 17, 2012, the entirety of which application is incorporated by reference herein.

BACKGROUND OF THE INVENTION

1. Field of the Invention

Embodiments of the invention relate to semiconductor processing in general and in particular to systems and methods for manipulating an electrode assembly in relation to semiconductor processing applications.

2. Discussion of Related Art

Ion implantation is a process of introducing chemical species into a workpiece by bombardment of the workpiece with energized ions. In semiconductor manufacturing, ion implanters are used for doping processes that alter the type and level of conductivity of target materials. A precise doping profile in a workpiece, such as an integrated circuit (IC) substrate, and its thin-film structure is important for proper IC performance. To achieve a desired doping profile, one or more ion species may be implanted in different doses and at different energy levels.

FIG. 1 depicts an ion implanter system. The ion implanter 100 includes a an ion source 101, an electrode assembly 102 including a plurality of electrodes, and a plurality of beamline components 103 for manipulating ion energies and to cause an ion beam 10 to hit a target workpiece 114 at a desired energy.

As noted, ion implanters use electrodes to manipulate ion energies (i.e., guide, accelerate, or decelerate the ions in an ion beam). For example, the plurality of electrodes 104 may be used to extract and form an ion beam from an ion source. The position of these electrodes may need to be adjusted to account for changes in ion beam energy or ion beam current. The orientation of these electrodes also may need to be adjusted to correct for mechanical misalignments or to change the ion beam direction. As electrodes become larger or as ion beams increase in size, it becomes more challenging to support the electrodes at a single end. There is a need, therefore, for an improved device to adjust the position of large electrodes in an ion implanter to maintain a desired uniform ion beam.

SUMMARY OF THE INVENTION

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

An electrode adjustment assembly is disclosed for use in workpiece processing. The assembly may include an electrode having first and second ends, a first manipulator coupled to the first end, and a second manipulator coupled to the second end. The first and second manipulators may be configured to selectively impart movement to the first and second ends of the electrode. The first and second manipulators may be independently actuatable so that the first and second ends of the electrode can be adjusted independent of one another.

An electrode adjustment assembly is disclosed for use in workpiece processing. The assembly may include an electrode assembly having first and second ends, a first manipulator coupled to the first end and a second manipulator coupled to the second end. The first and second manipulators may be configured to selectively and independently impart movement to the first and second ends of the electrode assembly.

A method is disclosed for adjusting an electrode as part of a workpiece processing operation. The method may comprise: adjusting first and second ends of an electrode using first and second independently controllable manipulators associated with the first and second ends, respectively, wherein adjusting the first and second ends adjusts a parameter of an ion beam received through an aperture in the electrode.

BRIEF DESCRIPTION OF THE DRAWINGS

The accompanying drawings illustrate preferred embodiments of the disclosed method so far devised for the practical application of the principles thereof, and in which.

DESCRIPTION OF EMBODIMENTS

The embodiments are described herein in connection with an ion implanter. This ion implanter may be a beam-line ion implanter that mass analyzes the ion beam or a flood implanter that does not mass analyze the ion beam. However, these embodiments also can be used with other systems and processes involved in semiconductor manufacturing or other systems that use ions. These embodiments may be used in an implanter for flat panels, semiconductor or IC substrates, solar cells, or other workpieces. Thus, the invention is not limited to the specific embodiments described below.

Figure 1:
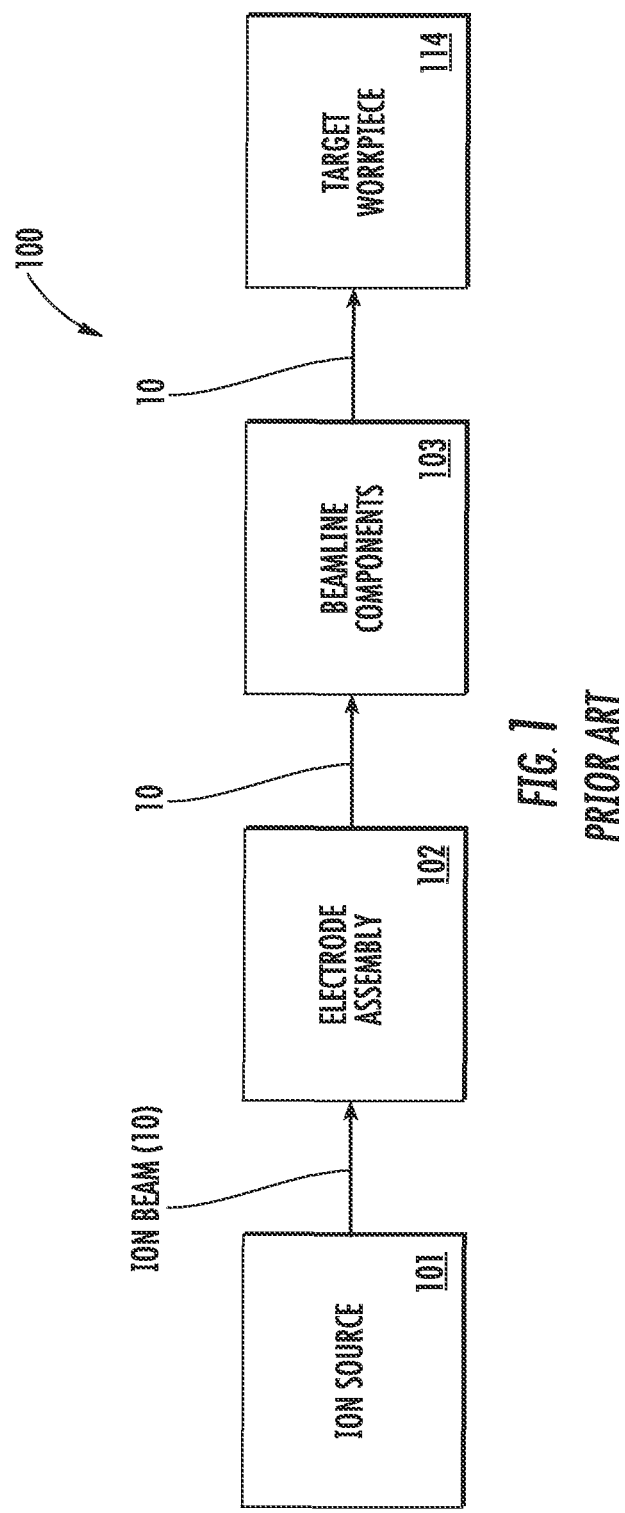
FIG. 1 is a schematic illustration of an exemplary ion implant system.
Figure 2:
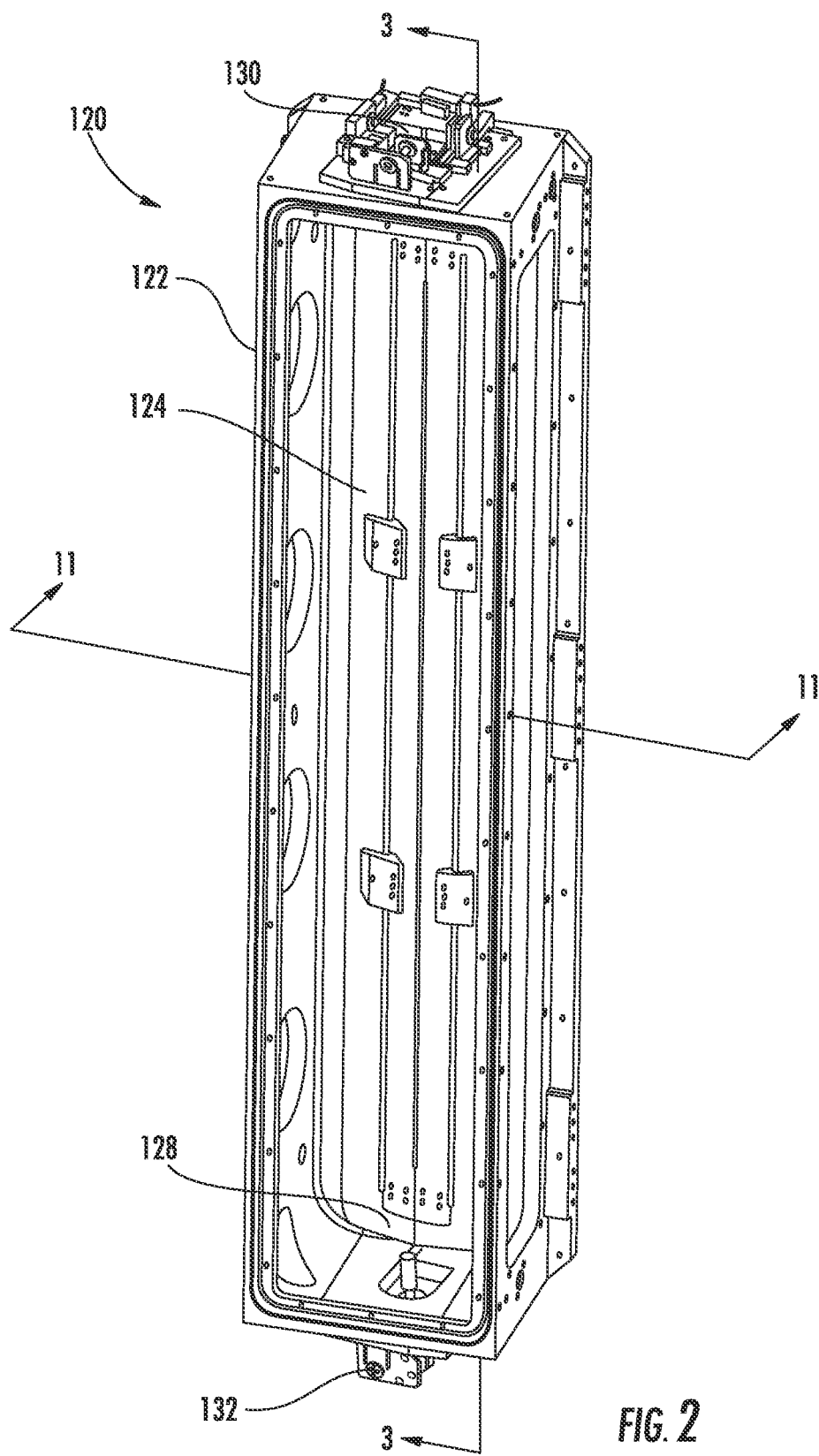
FIG. 2 is an isometric view of a source chamber assembly of the system of FIG. 1.
Figure 3:
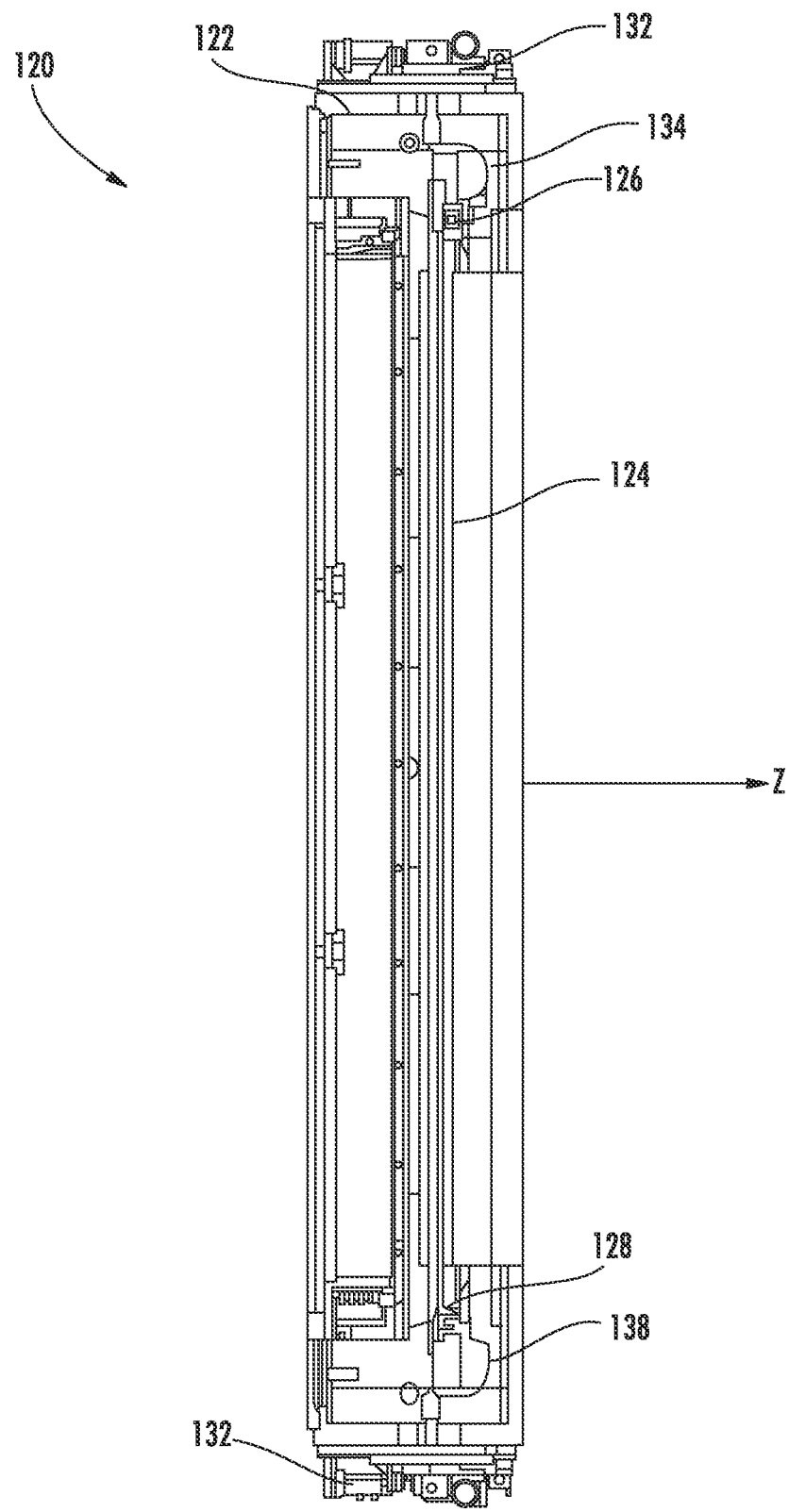
FIG. 3 is a cross-section view of the source chamber assembly of FIG. 2 taken along line 3-3.

FIGS. 2 and 3 show an exemplary source chamber assembly 120 which may include a chamber portion 122 and a suppression/ground electrode assembly ("electrode assembly") 124. As will be appreciated, the interior of the chamber portion 122 and the electrode assembly 124 will be subject to high vacuum conditions during operation, while the outside of the chamber portion 122 will be exposed to ambient conditions. The electrode assembly 124 has first and second ends 126, 128 coupled to first and second manipulators 130, 132 positioned outside of the chamber portion 122. As will be described in greater detail later, the manipulators 130, 132 can be used to adjust the position of the first and second ends 126, 128 of the electrode assembly 124 in order to adjust one or more properties of the ion beam 10 (FIG. 1) passing there through in the direction of arrow "Z".

Figure 4:
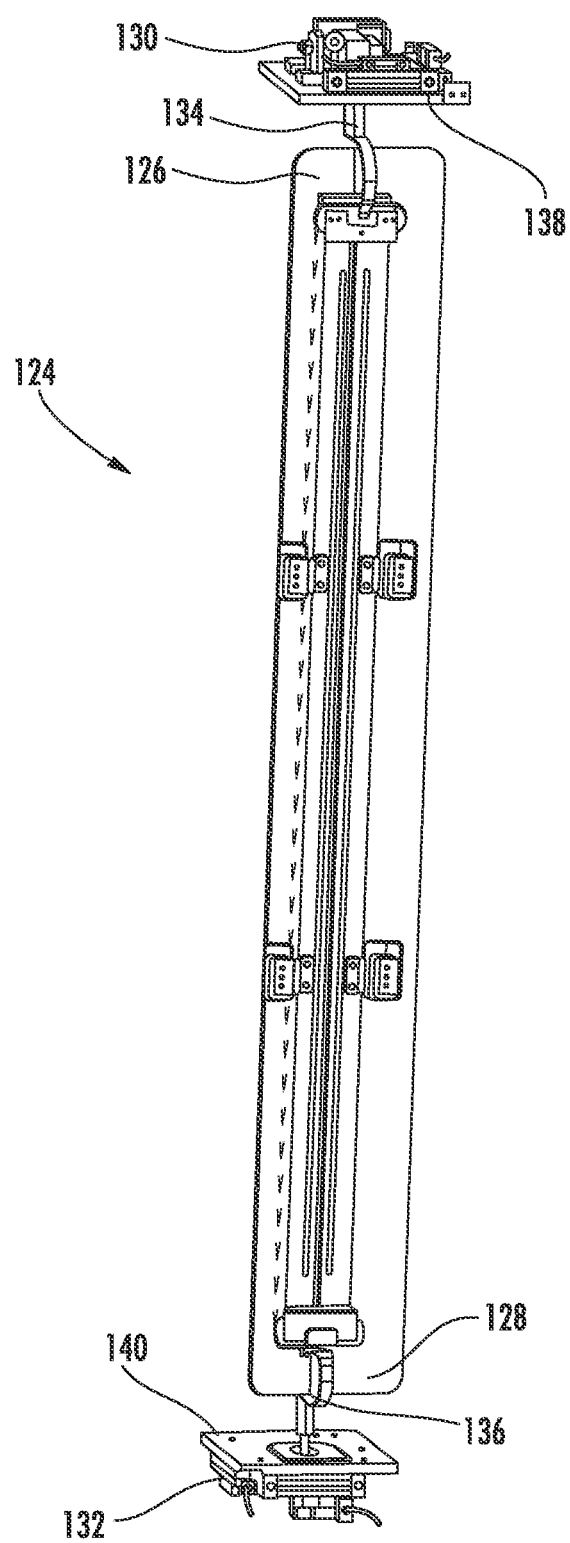
FIG. 4 is an isometric view of an embodiment of a suppression-ground electrode assembly portion of the source chamber assembly of FIG. 2.

FIG. 4 shows the electrode assembly 124 and first and second manipulators 130, 132 disassociated from the chamber portion 122. Visible in this view are first and second actuation arm assemblies 134, 136 that couple the first and second manipulators 130, 132 to respective first and second ends 126, 128 of the electrode assembly 124. As previously noted the electrode assembly 124 is disposed inside the chamber portion 122 and is exposed to high vacuum conditions. The first and second manipulators 130, 132 are outside the chamber portion 122 and are exposed to ambient conditions. Since the first and second actuation arm assemblies 134, 136 must penetrate the chamber portion 122, first and second seal plates 138, 140 are positioned between the manipulators 130, 132 and the outer surface of the chamber portion 122 to prevent ambient air or other contaminants from entering the interior of the chamber portion 122 through the penetrations during operation.

Figure 5:
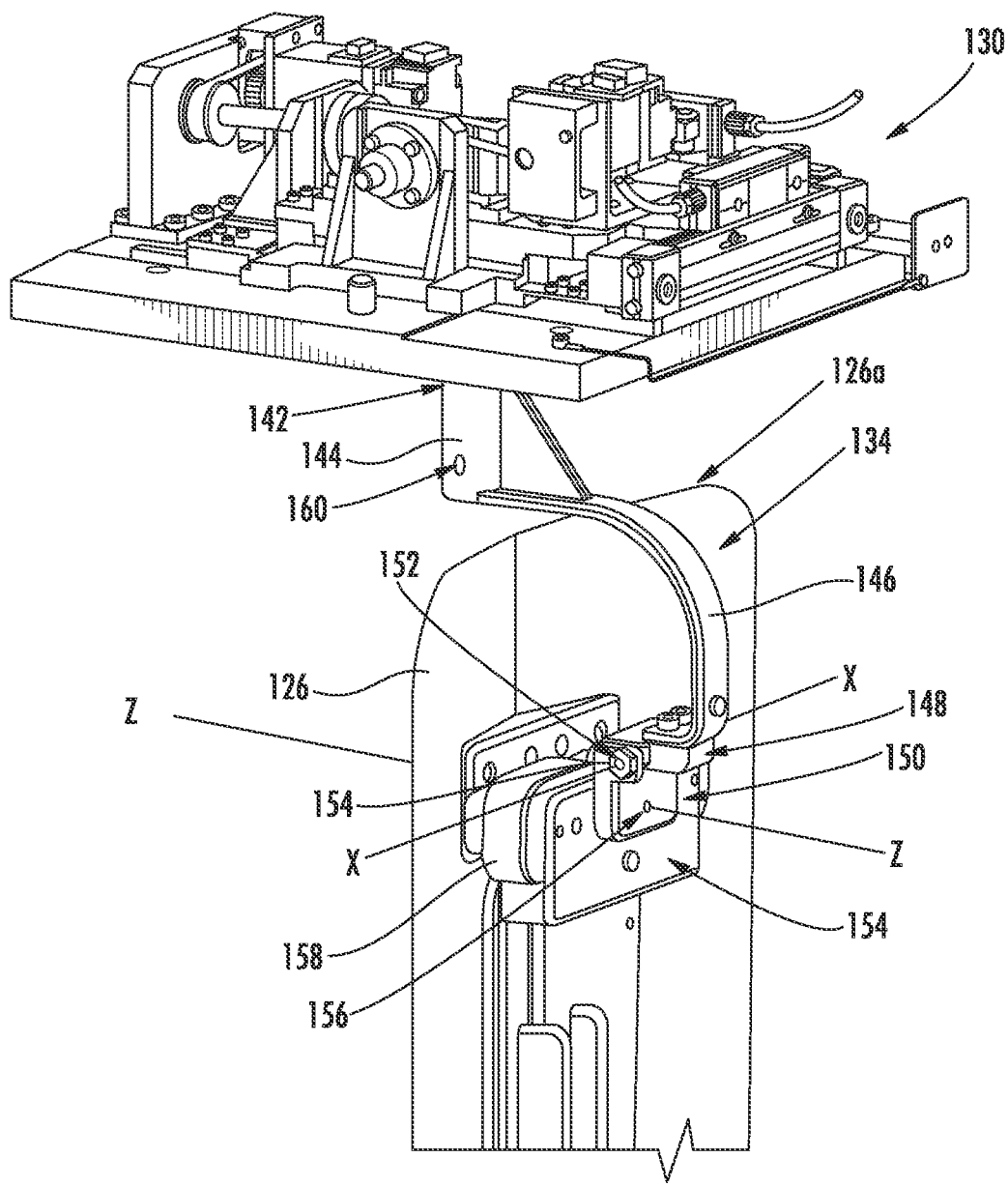
FIG. 5 is an isometric view of a portion of the suppression-ground electrode assembly of FIG. 4.

FIG. 5 shows the interconnection between the first manipulator 130 and the first end 126 of the electrode assembly 124 in greater detail. Although the description will proceed in relation to the first end of the assembly, it will be appreciated that the description will apply equally to the interconnection between the second manipulator 132 and the second end 128 of the electrode assembly. As can be seen, the first manipulator 130 is coupled to the first end 126 of the electrode assembly 124 via the first actuation arm assembly 134. The actuation arm assembly 134 may include a manipulator rod 142 configured to engage the first manipulator 130. The manipulator rod 142 may be coupled to a collar 144 which may slidably receive the rod. The collar 144 may be connected to an arm portion 146 which, in the illustrated embodiment, has a curved geometry that enables the arm portion to extend around a distal end 126a of the electrode assembly 124 to connect to the electrode assembly on a side opposite that of the incoming ion beam 10 (FIG. 3). In this way, a portion of the actuation arm assembly 134 is shielded from the ion beam by the first end 126 of the electrode assembly.

The arm portion 146 may be fixed to a first pivot block 148. The first pivot block 148 may be pivotably coupled to a second pivot block 150 via a first pin connection 152 so that the first and second pivot blocks are rotatable with respect to each other about axis "X-X." In one embodiment, axis "X-X" is aligned with a short dimension of the ion beam 10. The second pivot block 150 may be pivotably coupled to a mounting bracket 154 via a second pin connection 156 so that the second pivot block and the mounting bracket 154 are rotatable with respect to each other about axis "Z-Z." In one embodiment, axis "Z-Z" is aligned with the travel direction of the ion beam 10 (arrow Z in FIG. 3) and is orthogonal to the axis "X-X". Thus arranged, the electrode assembly 124 and the first manipulator 130 are rotatable with respect to each other about two mutually perpendicular axes. It will be appreciated that this arrangement is not limiting, and the pivot blocks may be arranged so that fewer or greater degrees of freedom are provided. Further, where multiple degrees of freedom are provided, they need not be orthogonally related.

It will be appreciated that the suppression electrode of the electrode assembly 124 may be maintained at a high voltage during operation, while the manipulator 130 may be held at ground potential. As such, a plurality of insulators 158 may be coupled between the mounting bracket 154 and the first end 126 of the electrode assembly.

As described, the electrode assembly 124 can pivot with respect to the manipulator 130 about the "X-X" and "Z-Z" axes. The assembly 124 may also be adjustable along the "Y-Y" axis (FIG. 7) via sliding movement between the manipulator rod 142 and collar 144 of the actuation arm assembly 134. In one embodiment, the "Y-Y" axis is aligned with a long dimension of the ion beam 10. A set screw 160 may be disposed in an opening in the collar 144 such that a tip of the screw engages the rod 142 to lock the two in position once a desired "Y" position of the electrode assembly 124 is obtained. This can be done in an initial manual adjustment step in which a user can physically manipulate the "Y" position of the electrode assembly 124 to obtain a desired position of the electrodes with respect to the beam 10. It will be appreciated, however, that the "Y" position of the electrode assembly could be automatically controlled by providing an appropriate adjustment mechanism as part of the manipulator 130.

In operation, the electrode assembly 124 will undergo thermal expansion in the "Y-Y" direction. Thus, the set screw 160 associated with the first manipulator 130 may be used to lock the rod 142 and collar 144 together, while the set screw associated with the second manipulator 132 may be eliminated (or not engaged with the rod) so as to allow the rod to slide within the collar to accommodate expansion of the assembly during operation.

Figure 6:
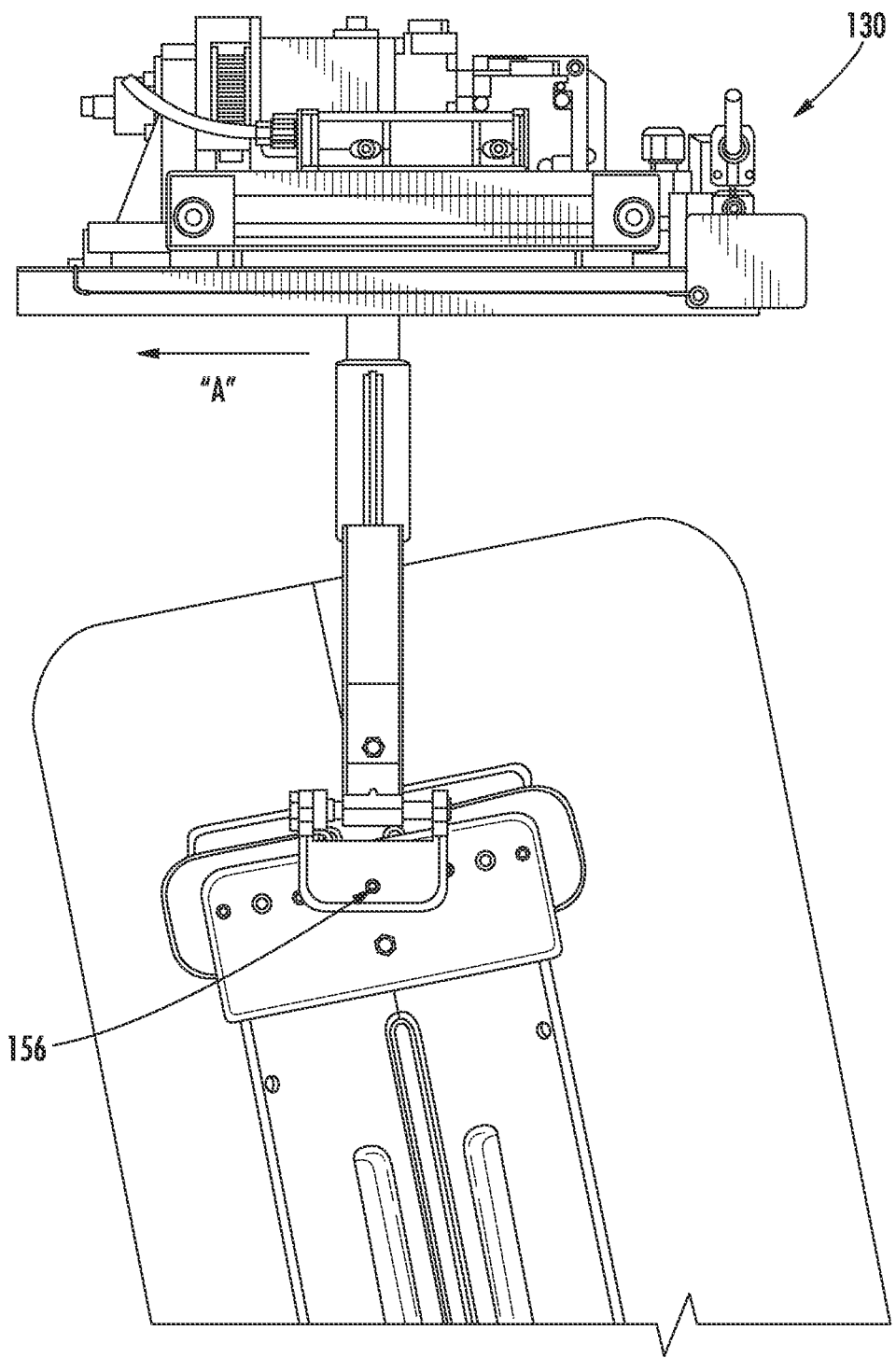
FIG. 6 is an alternative first side view the portion of the suppression-ground electrode assembly of FIG. 5 in which the assembly is rotated about a first axis.
Figure 7:
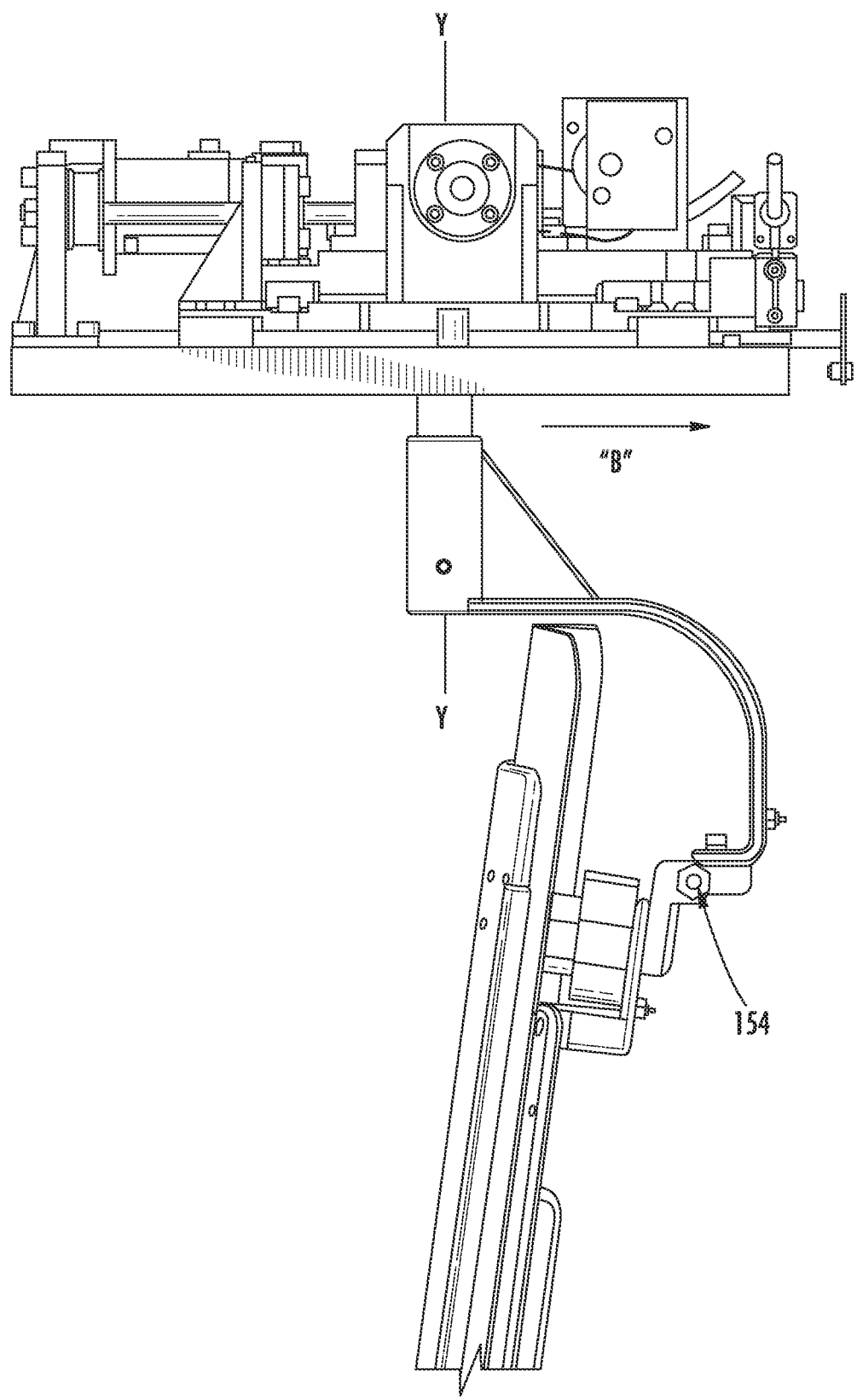
FIG. 7 is an alternative second side view the portion of the suppression-ground electrode assembly of FIG. 5 in which the assembly is rotated about a second axis.
Figure 9:
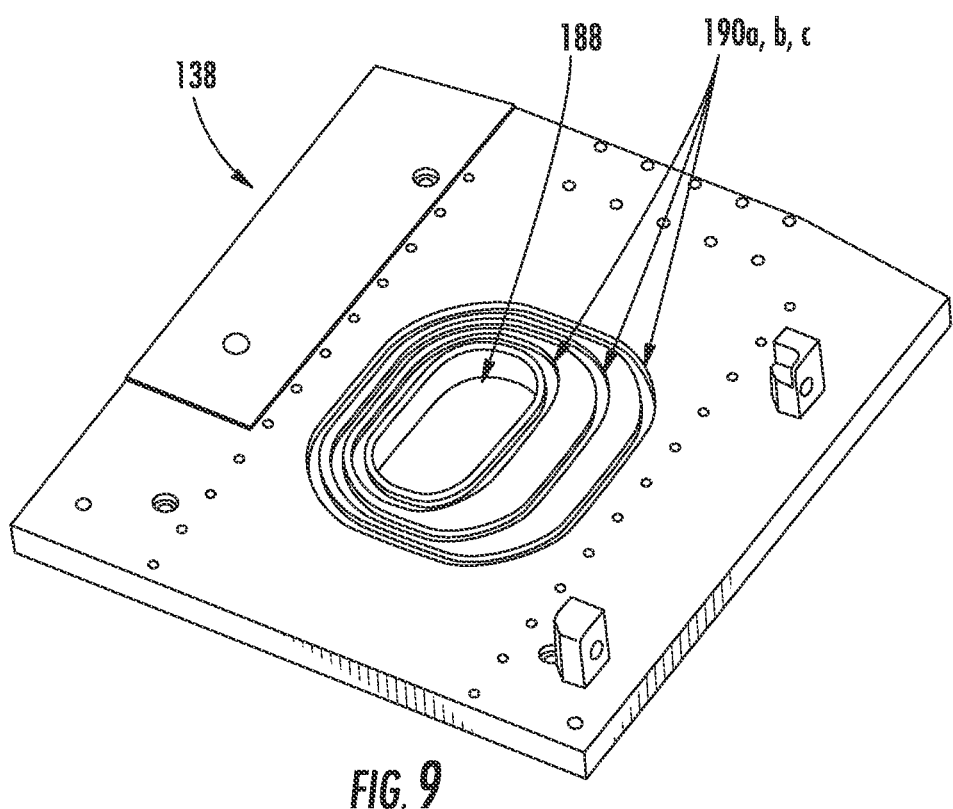
FIG. 9 is an isometric view of a seal plate assembly of the suppression-ground electrode assembly of FIG. 4.

FIGS. 6 and 7 show exemplary movement modes of the electrode assembly 124 via the pin connections 154, 156. FIG. 6 illustrates the first end 126 of the electrode assembly 124 rotating about the "Z-Z" axis via second pin connection 156. This motion may be induced via the movement of the manipulator rod 142 in the direction of arrow "A," which is aligned with the "X-X" axis (FIG. 5). FIG. 9 illustrates the first end 126 of the electrode assembly 124 rotating about the "X-X" axis via first pin connection 154. This motion may be induced via the movement of the manipulator rod 142 in the direction of arrow "B," which is aligned with the "Z-Z" axis (FIG. 5).

As will be appreciated, a wide range of positions of the electrode assembly 124 may be achieved through relative movement of the first and second ends 126, 128 of the electrode assembly 124 using the first and second manipulators 130, 132 and the first and second pin connections 154, 156. By moving of the electrode assembly 124 in such a manner, adjustments can be made to one or more properties of the ion beam 10, such as beam current level, beam current uniformity, and the like. Where beam current parameters are measured before, during or after an implant process, and where one or more parameters fall outside a predetermined range, the ion beam may be re-tuned by adjusting the position of the electrode assembly 124 using the manipulators.

Figure 8:
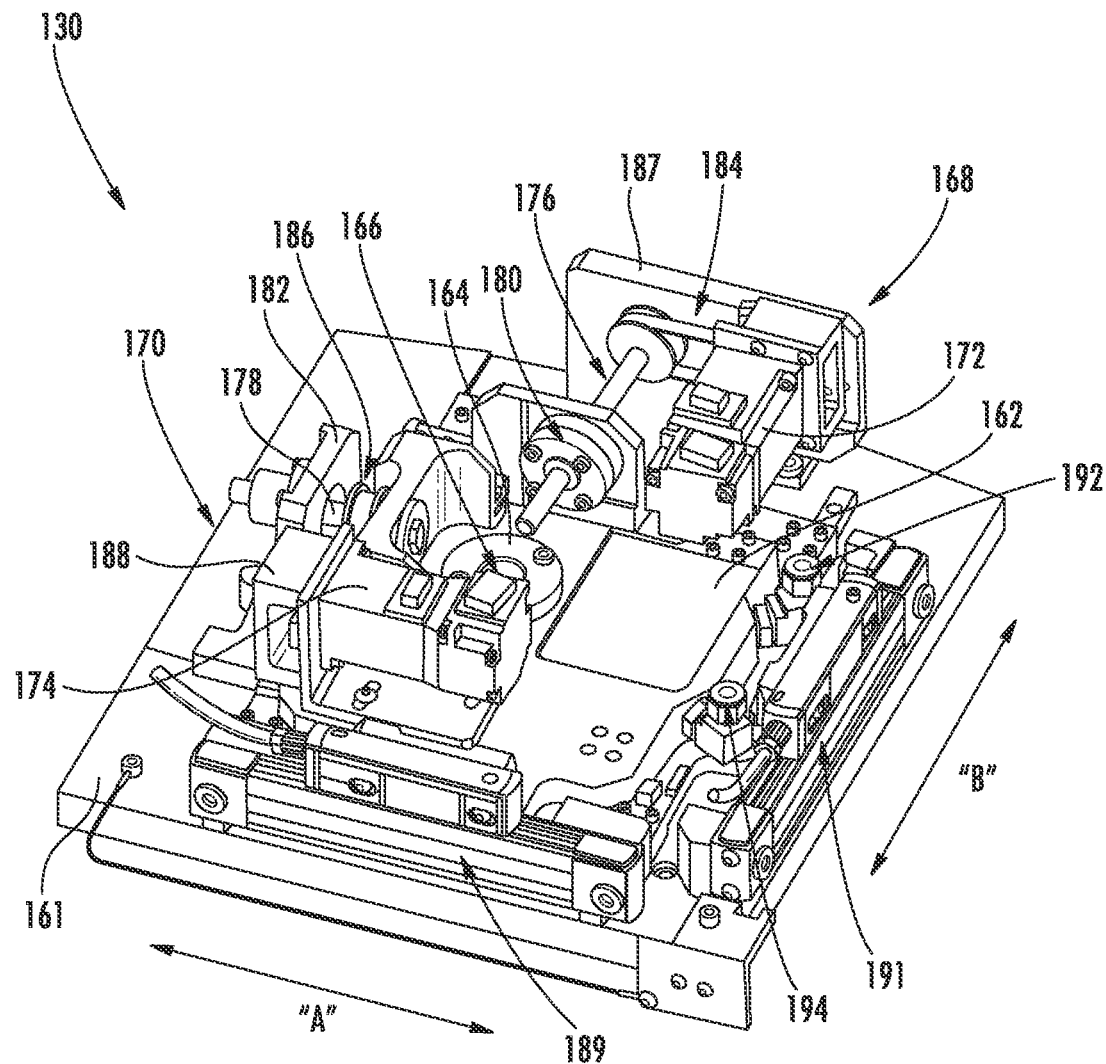
FIG. 8 is an isometric view of an exemplary manipulator of the suppression-ground electrode assembly of FIG. 4.

FIG. 8 shows the components of the first manipulator 130. It will be appreciated that the following description will apply equally to the first and second manipulators 130, 132. The manipulator 130 may include a base plate 161 upon which a slide table 162 is mounted for movement thereon. The slide table 162 may include a rod receiving collar 164 having an opening 166 for receiving an end of the manipulator rod 142 so that a desired motion may be imparted to the rod and, in turn, the first end 126 of the electrode assembly 124. The slide table 162 may be positioned for movement with respect to the base plate 161 in two mutually orthogonal directions, indicated by arrows "A" and "B." In the illustrated embodiment, movement of the slide table 162 along arrow "A" results in movement of the first end 126 in a direction parallel to the "X-X" axis (FIG. 6), while movement along arrow "B" results in movement of the first end 126 in a direction parallel to the "Z-Z" axis (FIG. 5).

The slide table 162 may be moved back and forth on the base plate 161 via first and second actuators 168, 170. In the illustrated embodiment, the first and second actuators 168, 170 comprise first and second servomotors 172, 174 coupled to respective screws 176, 178. The screws 176, 178 are received by correspondingly threaded openings in first and second flanges 180, 182 connected to the slide table. As will be understood, actuation of the servomotors 172, 174 causes respective belt/pulley arrangements 184, 186 to rotate the associated screw 176, 178. Since the screws 176, 178 are axially fixed to respective motor brackets 187, 188 (which themselves are fixed to the base plate 161), rotation of the screws 176, 178 causes movement of the respective flange 180, 182 via the threaded interaction between the screw threads and the threads in the flange openings. Movement of the flanges 180, 182 causes movement of the slide table 162 on the base plate 161, which, in turn, may move the manipulator rod 142 by a desired amount. It will be appreciated that the first and second actuators 168, 170 may be controlled by entering coordinates for motion in "A" and "B" directions that will improve or degrade one or more conditions or properties of the ion beam 10. Incremental adjustments can be made in both axes until desired beam specifications are achieved. The first and second actuators 168, 170 can be independently adjustable to provide a desired movement of the manipulator rod 142.

In the illustrated embodiment, first and second optical sensors 189, 191 are positioned adjacent to the slide table 162 to provide verification of the position of the slide table 162 with respect to the base plate 161. These optical sensors 189, 191 may read the position of a calibrated tape positioned on the slide table 162 to determine position. This information may be provided to a control system (not shown) for use in controlling the position of the electrode assembly 124.

Figure 10:
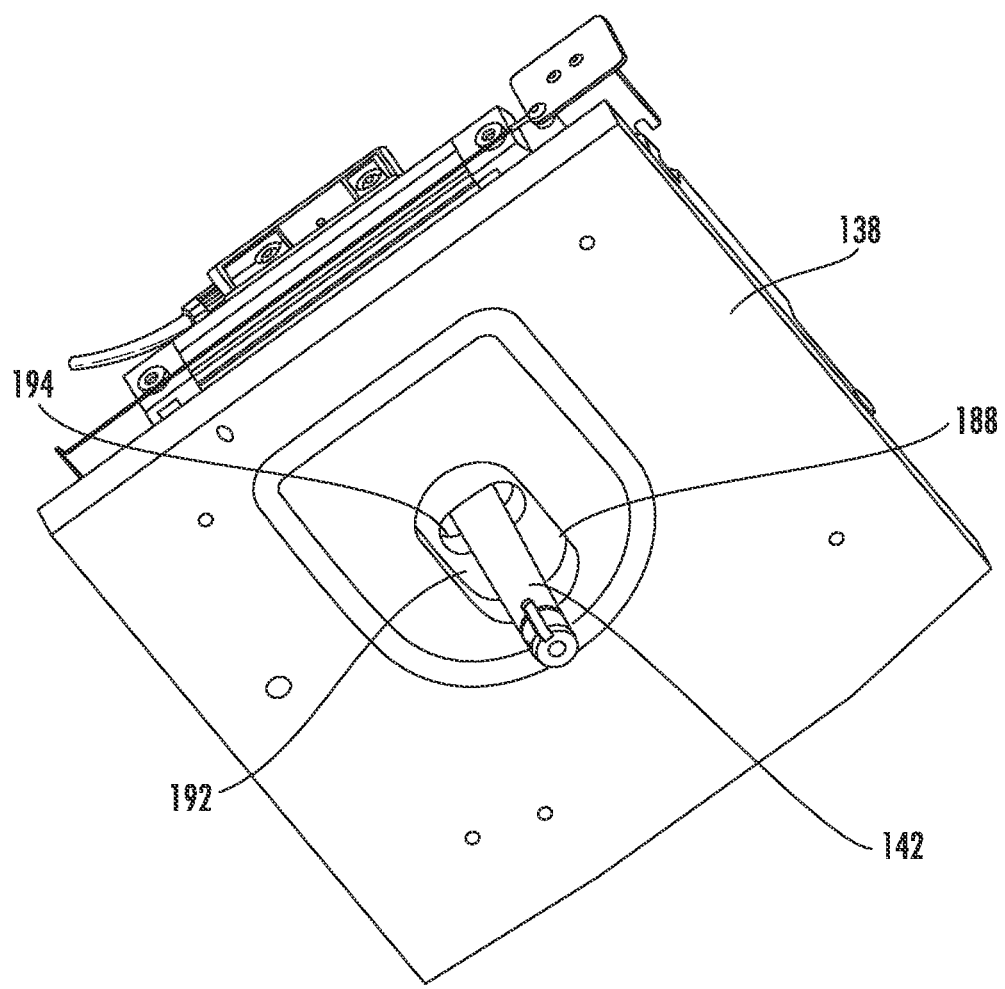
FIG. 10 is a reverse isometric view of the seal plate assembly of FIG. 9.

FIGS. 9 and 10 show an embodiment of the first seal plate 138 for sealing the associated manipulator 130 to the chamber portion 122 of the electrode assembly 124. Once again, it will be appreciated that the description will apply equally to the second seal plate 140. The seal plate 138 may have an opening 188 for receiving the manipulator rod 142 there through. A plurality of grooves 190*a, b,* and *c* may surround the opening 188 to provide a seal against the ingress of air or other gas into the chamber portion 122 during operation. In the illustrated embodiments, the grooves 190*a, b, c* are not symmetric about the opening 188. The differentially spaced gaps allow for relative motion between adjacent plates and their respective openings to enable differential pumping of two stages between atmospheric pressure and high vacuum conditions within the chamber portion 122, as will be described in greater detail below. Although not shown, elastomeric o-rings may be disposed in each of the grooves 190*a, b, c.*

The grooves 190*a, b, c* together may comprise a differential pumping region in which the grooves 190*a, b, c* are coupled to openings (not shown) in the base plate 161 of the manipulator, or in an intermediate plate (not shown). The openings may be coupled to a suction source via tube connections 192, 194 (see FIG. 8) so as to draw gas out through the grooves 190*a, b,* and *c.* Thus, any air or other gas traveling from the ambient and/or between the seal plate 138 and the chamber portion 122 will be drawn out between the grooves 190*a, b, c* or seals before reaching the interior of the chamber portion, thus minimizing or eliminating entry of gas from the air bearing or the ambient atmosphere to the chamber portion.

An intermediate sealing plate 192 may also be provided between the seal plate 138 and the base plate 161. This intermediate sealing plate 192 can best be seen in FIG. 10. The intermediate sealing plate 192 may also have an opening 194 for receiving the manipulator rod 142 there through. Although not shown, the intermediate sealing plate 192 may include a plurality of pumped grooves similar to those previously described in relation to the seal plate 138 to minimize the chance for ingress of air or other contaminants into the chamber portion 122 during operation. These pumped grooves may be connected to a suction source (e.g., via tube connections 192, 194) to draw air or other gases out through the grooves before they reach the interior of the chamber portion.

It will be appreciated that although the illustrated embodiment employs a differential pumping arrangement to seal the process chamber from the ambient and the air bearing, other sealing arrangements could be used. For example, one or more lip seal arrangements could be used in lieu of, or in addition to, the series of pumped grooves. In addition, greater or fewer than three grooves could be used, as desired.

Figure 11:
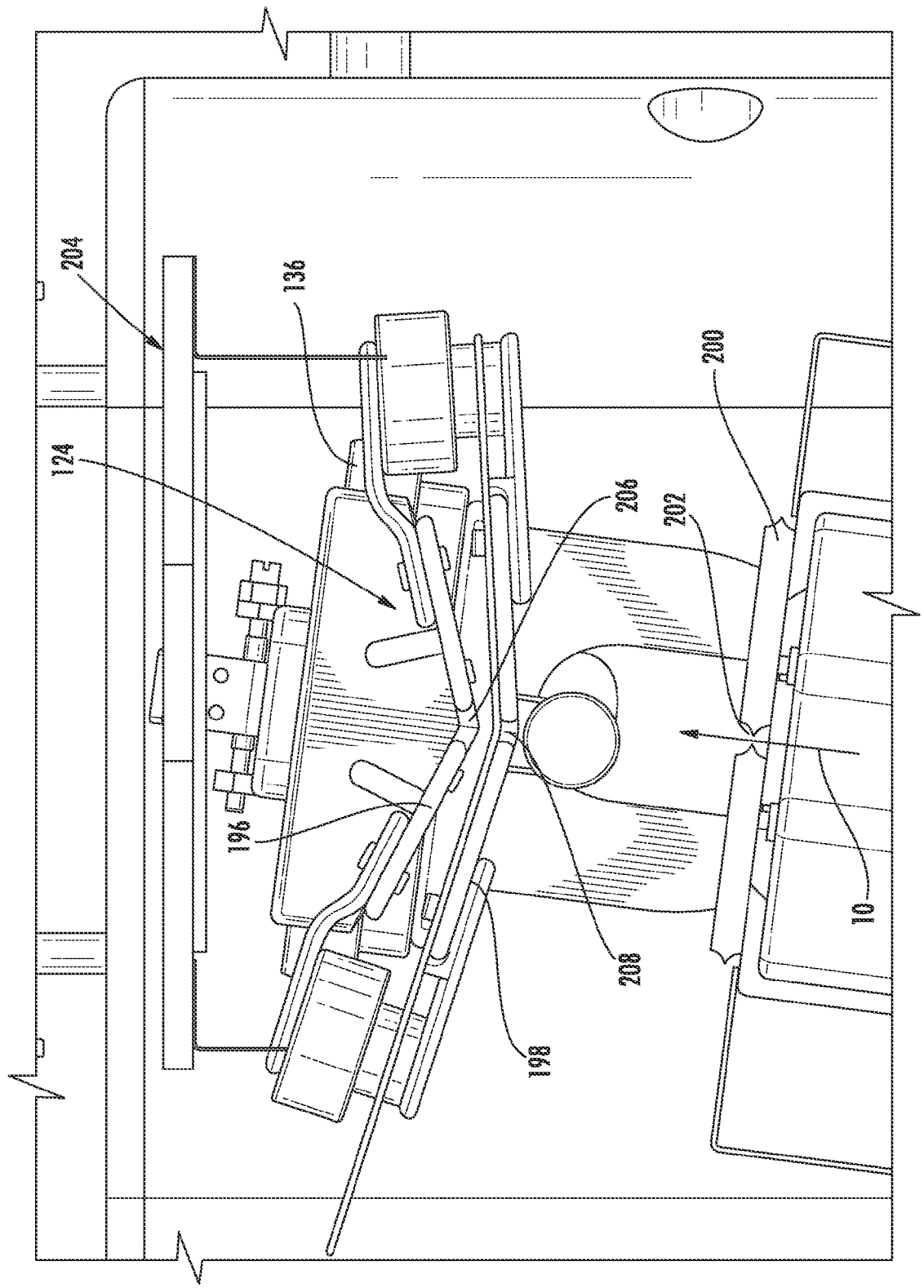
FIGS. 11-14 are a series of cross-section views of the of the suppression-ground electrode assembly of FIG. 2, taken along line 11-11 of FIG. 2, showing various positioning of the source and ground electrodes using a pair of manipulators.
Figure 12:
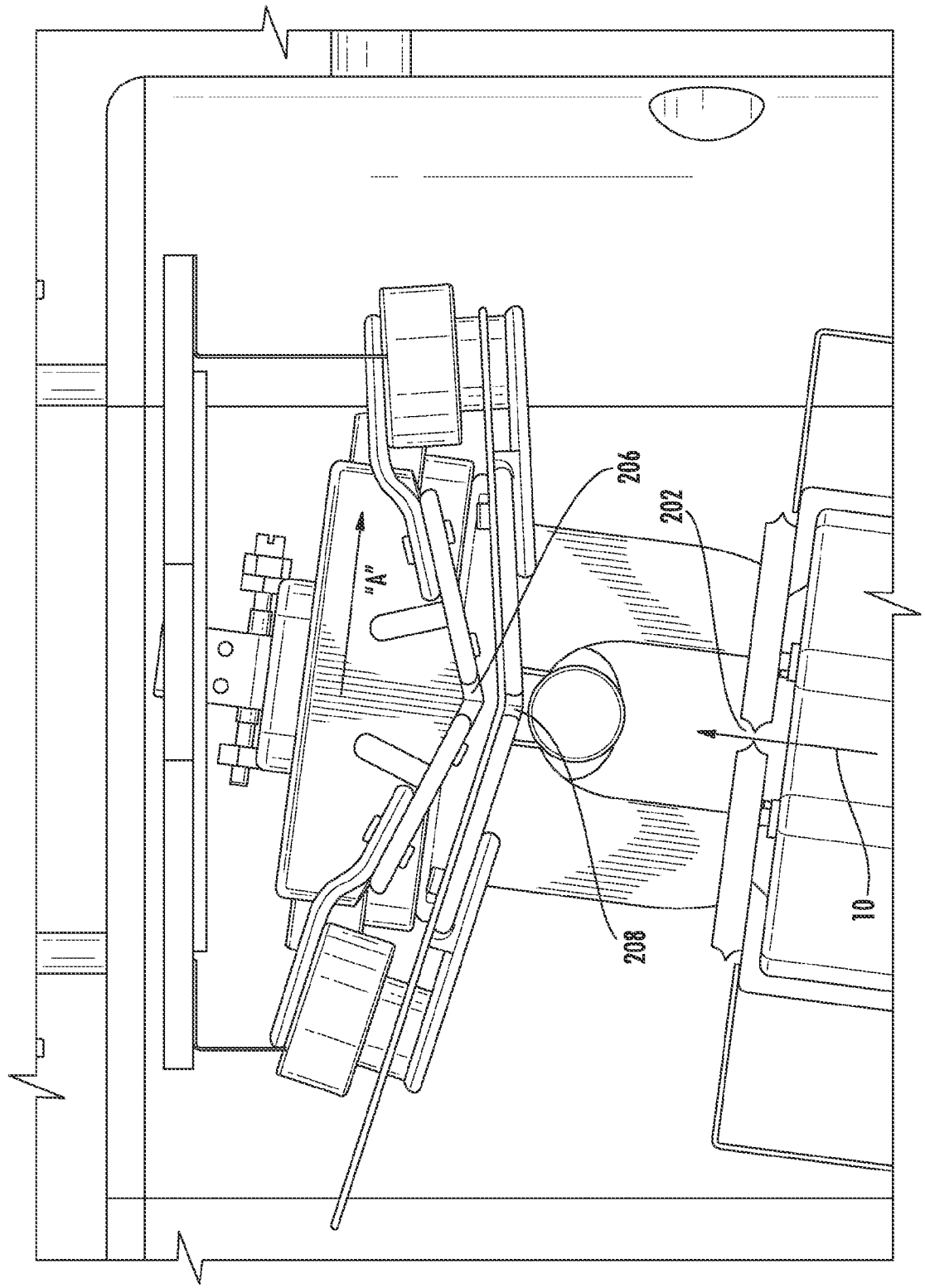
Figure 13:
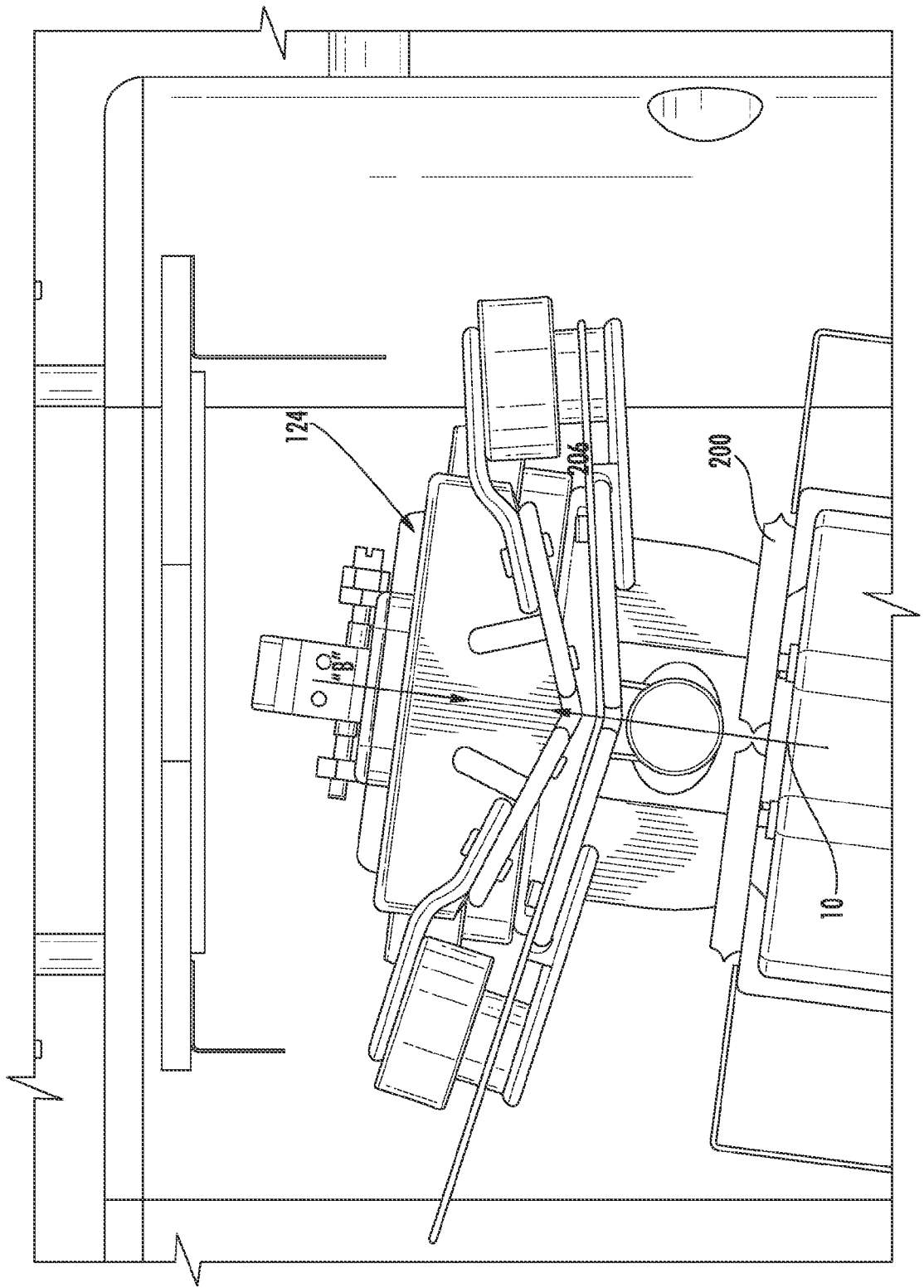
Figure 14:
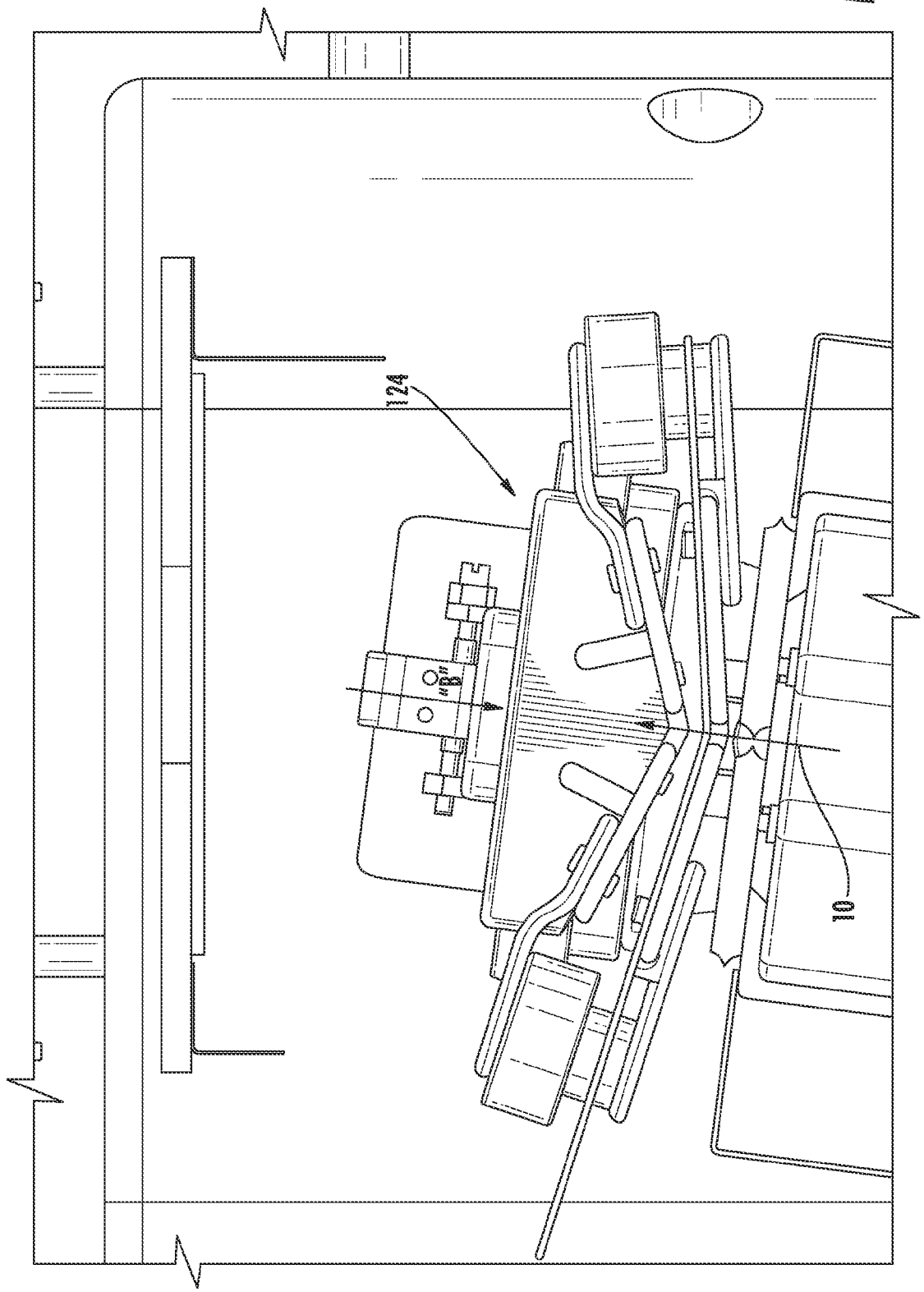

Referring now to FIGS. 11-15, a variety of positioning of the electrode assembly 124 is shown. It will be appreciated that these positioning can be achieved using the manipulators 130, 132 (FIG. 2). In addition, although these discrete positioning of the electrode assembly 124 are shown, it will be appreciated that a wide variety of other positioning can also be achieved using the disclosed arrangement. These views show a cross-section of the electrode assembly 124 looking down at the second adjustment arm assembly 136. FIG. 11 shows the relative position of the ground electrode 196, the suppression electrode 198 and the extraction electrode 200. As previously noted, the ground and suppression electrodes 196, 198 may together make up the electrode assembly 124, and thus the position of these electrodes can be manipulated with respect to the extraction electrode 200 and the ion beam 10 which is shown passing through a gap slot 202. Also shown in this view is a magnetic suppression plate 204 configured to prevent ions from streaming back toward the electrode assembly 124. As can be seen, the electrode assembly 124 has been adjusted so that the slots 206, 208 of the ground and suppression electrodes are slightly off-center with respect to the gap slot 202 of the extraction electrode 200. FIG. 12 shows the electrode assembly 124 shifted in the direction of arrow "A," which is parallel to the "X-X" axis shown in FIG. 5. In this position, the slots 206, 208 of this portion of the assembly align with the gap slot 202 of the extraction electrode. FIG. 13 shows the electrode assembly 124 shifted in the direction of arrow "B," which is parallel (and opposite) to the direction of the ion beam 10 and to the axis Z-Z (FIG. 5), thus bringing the illustrated portion of the assembly closer to the extraction electrode 200. FIG. 14 shows yet further adjustment of the electrode assembly 124 in the direction of arrow "B," bringing the assembly even closer to the extraction electrode 200.

This alignment between the electrodes and their respective gaps, along with other beam control elements, will dictate the transmission of ions via the ion beam 10 to a workpiece (i.e., flat panel or semiconductor substrate). Different ions and implanted depths (also referred to as "recipes") require different optimized positions. The range of movement along each axis imparted by the manipulators can, in some embodiments, be sufficient to cover all desired recipes.

The extraction, suppression and ground electrodes can be pre-aligned using any of a variety of appropriate fixtures in order to acquire "0 positions" for all axes of both manipulators. The goal is to provide a home position in two directions for the manipulators to start and return to when power is lost or shut down intentionally.

In some embodiments movements of ±7.5 mm along the X-X axis and ±18 mm along the Z-Z axis are facilitated, though other movement amounts are possible. The manipulators 130, 132 may be configured to support the weight of the electrode assembly 124, where such an assembly has weight and dimensions that accommodate an ion beam for large workpieces, such as flat panels.

As will be appreciated, the use of a pair of manipulators 130, 132 enables multiple modes of movement. First, the manipulators may move together in the same direction to adjust the entire electrode assembly 124 along the X-X and/or Z-Z axis. In some embodiments, motion along the X-X and/or Z-Z axis may be adjusted during setup and calibration of the system or during recipe creation and beam tuning Small values of Z-Z axis movement (i.e., moving the suppression and ground electrodes are closer to the front plate of the ion source) are generally desirable when higher ion beam currents are extracted or when the ion beam energy is lower. Adjustments along the X-X axis may typically correct for beam misalignment.

The manipulators 130, 132 may also move in opposite directions, which leave the center of the electrode assembly 124 stationary while the first and second ends 126, 128 of the electrode assembly move in opposite directions with respect to this center. Such movement may correct for misalignment of the electrode assembly 124.

Further, one or both of the manipulators 130, 132 may adjust along the X-X and/or Z-Z axes, which may be referred to as adjusting ΔX or ΔZ. ΔX and ΔZ may be used during beam tuning to correct for misalignment. The misalignment may manifest as high current on the suppression electrode power supply, lower overall transmitted ion beam current through the system, or as a non-uniform ion beam current as a function of position along the ribbon ion beam. Mechanical misalignments typically happen due to assembly error, limits on fabrication accuracy, or from thermal expansion of the components due to elevated temperatures during operation of the implanter. ΔX and ΔZ also may be used to adjust for ion beam conditions. This includes raising the ion beam current, which may require along the Z-Z axis toward the ion source, or changing ion beam energy. Lower ion beam energies generally have a smaller value along the Z-Z axis. Position of the assembly along the X-X axis interacts with the analyzer magnet and may determine the ion beam trajectory through the ion implanter.

While an electrode assembly connected to manipulators is specifically disclosed herein, in an alternate embodiment the manipulators may be connected to individual electrodes within the ion implanter. This may increase the number of manipulators employed to adjust the electrode positions, but it can also enable finer positioning. As will be appreciated, use of the embodiments disclosed herein enables dynamic positioning of long or large electrodes. This positioning may reflect a large range of different ion beam energies or extracted ion beam currents.

Figure 15:
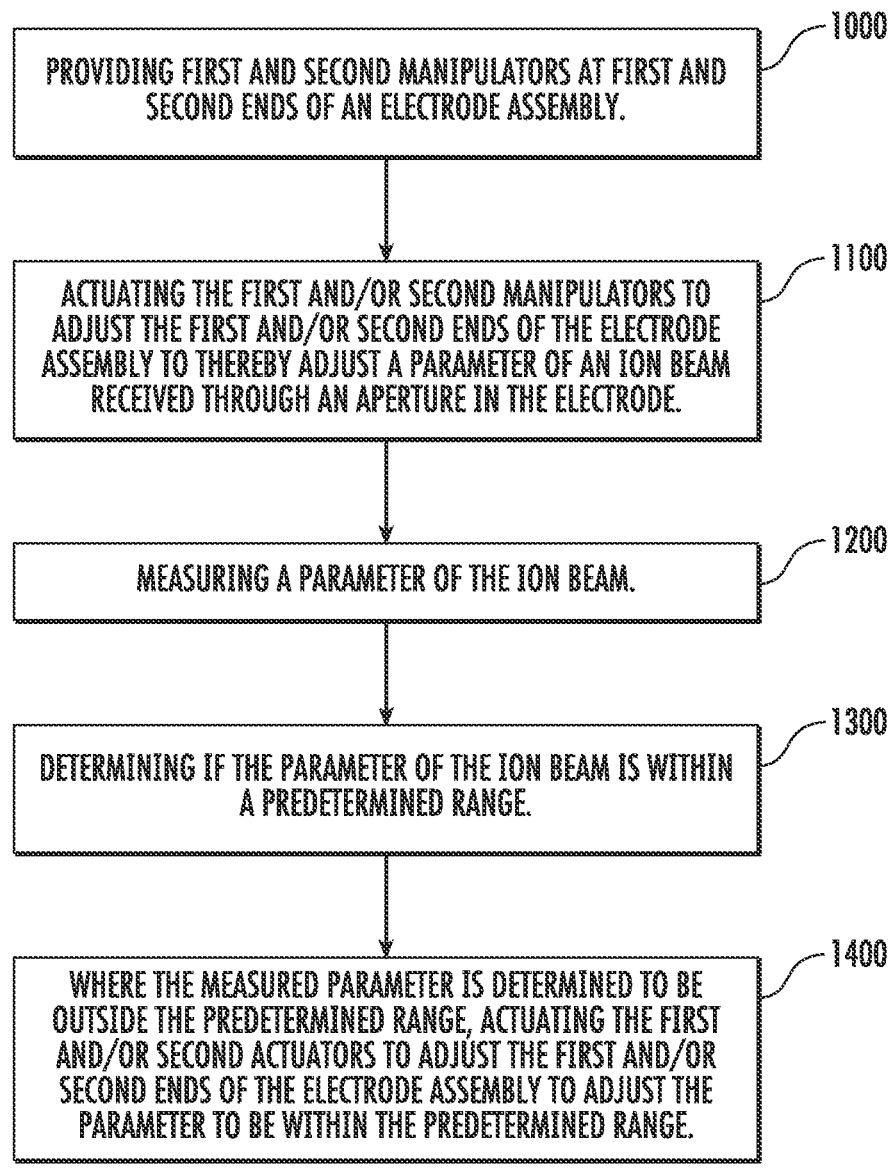
FIG. 15 is a flowchart illustrating an exemplary method according to the disclosure.

Referring now to FIG. 15, an exemplary method of adjusting an electrode assembly will be described. At step 1000, first and second manipulators are provided at first and second ends of an electrode assembly. The first and second manipulators can be configured to adjust the positions of the first and second ends of the electrode assembly independently. At step 1100, the first and/or second manipulators are actuated to adjust the first and/or second ends of the electrode assembly to thereby adjust a parameter of an ion beam received through an aperture in the electrode. At step 1200 a parameter of the ion beam may be measured. At step 1300, a determination is made as to whether the measured parameter is outside a predetermined range. At step 1400, the first and/or second actuators may be actuated to adjust the first and/or second ends of the electrode assembly to adjust the parameter of the ion beam to be within the predetermined range.

In some embodiments, adjusting the first and second ends of the electrode comprises moving one of the first and second ends in at least one of two mutually perpendicular directions. In other embodiments, adjusting the first and second ends of the electrode comprises moving the first and second ends in at least one of two mutually perpendicular directions. In additional embodiments, a first of the two mutually perpendicular directions may be aligned with a travel direction of the ion beam. In further embodiments, moving at least one of the first and second ends in at least one of two mutually perpendicular directions comprises applying respective forces to first and second manipulator assemblies associated with the first and second ends. Applying respective forces can comprise adjusting a position of first and second actuation members coupled to the first and second manipulator assemblies. The respective forces may be applied via actuators positioned outside a vacuum chamber, and wherein the first and second manipulator assemblies are positioned within the vacuum chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. While the invention has been disclosed with reference to certain embodiments, numerous modifications, alterations and changes to the described embodiments are possible without departing from the spirit and scope of the invention, as defined in the appended claims. Accordingly, it is intended that the present invention not be limited to the described embodiments, but that it has the full scope defined by the language of the following claims, and equivalents thereof.

What is claimed is:

1. An electrode adjustment assembly for use in workpiece processing, the assembly comprising:
    an electrode having first and second ends; and
    a first manipulator coupled to the first end and a second manipulator coupled to the second end, the first and second manipulators configured to selectively impart movement to the first and second ends of the electrode;
    wherein the first and second manipulators are independently actuatable so that the first and second ends of the electrode can be adjusted independent of one another,
    wherein the independent adjustment of the first and second ends of the electrode is capable of imparting rotation of the electrode about two mutually perpendicular axes, and
    wherein the first and second manipulators are configured to impart translational movement to the first and second ends of the electrode along first and second orthogonal axes.

2. The electrode adjustment assembly of claim 1, wherein the first and second manipulators are each configured to impart the translational movement to the first and second ends of the electrode along first and second orthogonal axes via sliding movement by a manipulator rod, the manipulator rod coupled to a collar, the collar configured to slidably receive the manipulator rod.

3. The electrode adjustment assembly of claim 1, wherein each of the first and second manipulators comprise first and second pin connections.

4. The electrode adjustment assembly of claim 3, wherein the first and second manipulators are actuatable via first and second actuation members disposed through an opening in a vacuum chamber.

5. The electrode adjustment assembly of claim 4, wherein the first and second actuation members engage respective actuators outside of the vacuum chamber, and wherein the electrode assembly and the first and second manipulators are disposed within the vacuum chamber.

6. The electrode adjustment assembly of claim 1, wherein the electrode comprises an assembly including a suppression electrode and a ground electrode.

7. The electrode adjustment assembly of claim 1 further comprising a lock mechanism configured to prevent rotation of the manipulators while allowing sliding motion of the manipulators.

8. An electrode adjustment assembly for use in workpiece processing, the assembly comprising:
    an electrode assembly having first and second ends; and
    a first manipulator coupled to the first end and a second manipulator coupled to the second end;
    wherein the first and second manipulators are configured to selectively and independently impart movement to the first and second ends of the electrode assembly,
    wherein the independent adjustment of the first and second ends of the electrode is capable of imparting rotation of the electrode about two mutually perpendicular axes, and
    wherein the first and second manipulators are configured to impart translational movement to the first and second ends of the electrode along first and second orthogonal axes.

9. The electrode adjustment assembly of claim 8, wherein the first and second manipulators and the electrode assembly are disposed within a vacuum chamber and the first and second manipulators are coupled to actuators disposed outside the vacuum chamber via respective actuating members that pass through at least one opening in a wall of the vacuum chamber.

10. The electrode adjustment assembly of claim 9, wherein the first and second manipulators comprise first and second gimbals and the first and second orthogonal axes are aligned with a travel direction of an ion beam and a short axis of the ion beam, respectively.

11. The electrode adjustment assembly of claim 9, wherein the electrode assembly comprises a suppression electrode and a ground electrode.

12. The electrode adjustment assembly of claim 8 further comprising a lock mechanism configured to prevent rotation of the manipulators while allowing sliding motion of the manipulators.

13. The electrode adjustment assembly of claim 8, wherein the first and second manipulators are each configured to impart the translational movement to the first and second ends of the electrode along first and second orthogonal axes via sliding movement by a manipulator rod, the manipulator rod coupled to a collar, the collar configured to slidably receive the manipulator rod.

14. A method for adjusting an electrode as part of a workpiece processing operation, comprising:
    adjusting first and second ends of an electrode using first and second independently controllable manipulators associated with the first and second ends, respectively,
    wherein adjusting the first and second ends adjusts a parameter of an ion beam received through an aperture in the electrode,
    wherein the independent adjustment of the first and second ends of the electrode includes imparting rotation of the electrode about two mutually perpendicular axes,
    wherein adjusting the first and second ends of the electrode comprises moving one of the first and second ends in at least one of two mutually perpendicular directions, and
    wherein moving one of the first and second ends in at least one of two mutually perpendicular directions comprises sliding movement by a manipulator rod, the manipulator rod coupled to a collar, the collar configured to slidably receive the manipulator rod.

15. The method of claim 14, wherein adjusting first and second ends of an electrode comprises independently adjusting the first and second ends of the electrode to adjust the parameter of the ion beam.

16. The method of claim 14, wherein moving at least one of the first and second ends in at least one of two mutually perpendicular directions comprises applying respective forces to first and second manipulator assemblies associated with the first and second ends.

17. The method of claim 16, wherein applying respective forces comprises adjusting a position of first and second actuation members coupled to the first and second manipulator assemblies.

18. The method of claim 17, wherein the respective forces are applied via actuators positioned outside a vacuum chamber, and wherein the first and second manipulator assemblies are positioned within the vacuum chamber.

* * * * *